Dec. 1, 1959 L. PENSAK 2,915,578

PHOTOVOLTAIC DEVICE

Filed July 29, 1957

INVENTOR.
LOUIS PENSAK
BY J L Whittaker
ATTORNEY

1

2,915,578

PHOTOVOLTAIC DEVICE

Louis Pensak, Princeton, N.J., assignor to Radio Corporation of America, a corporation of Delaware Application July 29, 1957, Serial No. 674,704

17 Claims. (Cl. 136—89)

This invention relates to improved devices for converting radiant energy into electrical energy, and improved methods of making such devices. More particularly, it relates to improved semiconductor photovoltaic cells which produce voltages greater than the bandgap of the semiconductor.

It is known that a large class of semiconductor devices are photo-sensitive. Such devices contain a rectifying barrier, or a PN junction, at the interface or boundary between regions of the semiconductor having different electrical properties. In a PN junction, the boundary is a transition region between P-type and N-type semiconducting materials. N-type semiconducting materials are those in which the charge carriers of electrical current are principally negative electrons. P-type semiconducting materials are those in which the charge carriers of electrical current are primarily electron-deficiency centers, which act as positive holes. When devices of this class are exposed to light, they develop a voltage across the terminals of the unit. The term "light" is used throughout this application as not limited to the visible spectrum, but in the broad sense of radiant energy which may be used to energize photovoltaic devices. Such devices, like photographic exposure meters, do not require any external power supply or biasing of the junction, and are known as photovoltaic cells.

It has been found that the maximum voltage obtainable from a semiconductor device containing a single PN junction is always limited to the width of the semiconductor bandgap or energy gap. The bandgap is the forbidden region of the electron energy spectrum in the semiconductor, and is equivalent to the energy range between the bottom of the conduction band and the top of the valence band. The conduction band is the range of states in the energy spectrum of a solid in which electrons can move freely, while the valence band is the range of energy states in a solid crystal in which lie the energies of the valence electrons which bind the crystal together.

It is believed that each photon of light which impinges on the semiconductor close to the PN junction introduces sufficient energy to liberate an electron-hole pair. The potential gradient of the PN junction causes the electrons and holes to diffuse in opposite directions across the junction, thus generating a flow of electric charges. If the light reaches the semiconductor at a distance from the rectifying barrier, the liberated carriers tend to recombine before they reach the barrier, and therefore do not contribute to the photocurrent. When the photovoltaic E.M.F. approaches in magnitude the energy gap of the semiconductor, no further increase in voltage is possible because the field in the junction is no longer able to separate electron-hole pairs. The potential gradient across the junction becomes zero. The bandgap of the particular semiconductive material utilized thus limits the maximum voltage which can be produced by devices of this type. The energy gap for germanium is 0.7 electron volt; for silicon, 1.1 electron volts. Some semiconductive binary compounds exhibit higher bandgaps. For example, in the group known as the III–V compounds, the energy gap for indium phosphide is 1.25 electron volts; for gallium arsenide, 1.35 electron volts; aluminum arsenide, 2.4 electron volts. In the group known as the II–VI compounds, cadmium telluride has an energy gap of 1.45 electron volts.

2

Photovoltaic semiconductive devices may be prepared with a series of alternate P regions and N regions, so as to comprise a multiplicity of PN junctions. However, when an electrode is connected to the region at each end of the series, and the entire unit is uniformly illuminated, the E.M.F. produced across the electrodes is not greater than the bandgap of the semiconductor used, since the photovoltage produced by one P to N transition region or junction is cancelled out by the equal and opposite photovoltage produced by the adjacent N to P transition region. Previous attempts have been made to produce high photovoltages by making a structure with alternate P and N regions, and then shielding every other junction from light. However, it is difficult to locate the PN interfaces with sufficient precision so that the shields may be properly positioned, particularly if the device contains many closely spaced junctions. Photovoltaic semiconductor devices which produce voltages much higher than the bandgap of the semiconductor have not hitherto been reported.

An object of the present invention is to provide an improved photovoltaic cell.

Another object of the invention is to provide an improved device for converting incident radiant energy into electrical energy.

Still another object of this invention is to provide an improved method of producing a semiconductive structure having an asymmetrical series of P-type regions alternating with N-type regions.

But another object of this invention is to provide an improved semiconductive body having a plurality of rectifying barriers.

Yet another object is to provide an improved photovoltaic semiconductor device which can produce an E.M.F. one or more orders of magnitude greater than the energy gap of the semiconductor.

These and other objects and advantages are obtained by depositing a layer of vaporized semiconductive material on a heated insulating substrate. The material is deposited at an angle to the normal to the substrate, that is, at an angle to the substrate substantially different from 90 degrees. Various semiconductive materials may be utilized, but cadmium telluride is preferred for high voltage output.

The invention will be described in greater detail with reference to the accompanying drawing, in which.

Figures 1, 2, 3, 4, 5, 6:
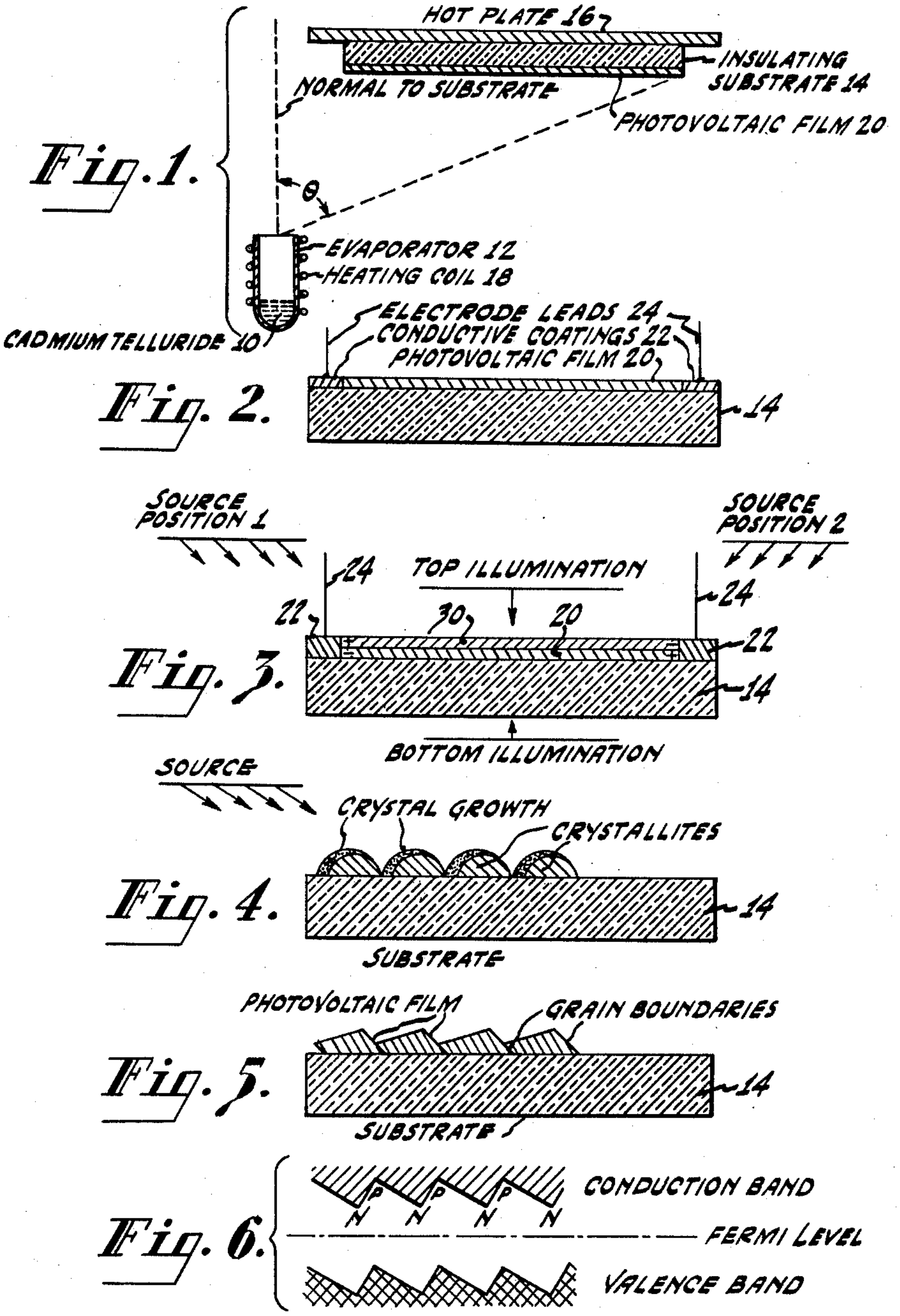
Figure 1 is a cross-sectional elevational view of the apparatus used in the process of the invention.
Figure 2 is a cross-sectional diagram of a photovoltaic cell made by the process illustrated in Figure 1.
Figure 3 is a cross-sectional elevational view of another photovoltaic device made by the method of this invention.
Figure 4 is a schematic diagram useful in explaining the growth of the photovoltaic film deposited according to this invention.
Figure 5 is a schematic diagram showing how grain boundaries may be produced in a photovoltaic film grown as depicted in Figure 4.
Figure 6 is a diagram of the energy levels of the structure shown in Figure 5.

Referring to Figure 1, the semiconductive material 10, which in this example is cadmium telluride, is placed in an evaporator 12 which is positioned at one side of an insulating slab 14. The slab 14 serves as a substrate for the deposition of a film of the semiconductor, and may for example consist of glass, quartz or the like. In this example, the slab 14 is a glass plate. The substrate is adjacent to a convenient heating means 16, such as an electrical hot plate. The entire system is enclosed in a container (not shown), having suitable pumping means to evacuate the system.

After the system has been evacuated to a pressure of about $10^{-5}$ mm. Hg, the evaporator is heated by any convenient heating means, such as a heating coil 18. The pressure in the system is not critical, and may range from about $10^{-3}$ mm. Hg. to as high a vacuum as possible. The cadmium telluride is vaporized, and the vapors are deposited on the glass substrate at a variable angle $\theta$ with respect to the normal to the substrate. For best results, the glass plate 14 is kept at a temperature of about 150° C. to 250° C. during the coating step. Sufficient cadmium telluride is deposited to form a layer 20 about 1 micron thick.

Referring to Figure 2, two conductive coatings 22 are applied to the substrate in contact with opposite ends of the deposited photovoltaic film 20. The conductive coatings may be made by any convenient method. For example, the ends of the substrate may be masked during the deposition of the semiconductor, and a coating of a conductive metal such as silver or copper, may subsequently be deposited on the substrate, at opposite ends of the film. Another method of fabricating the desired conductive coating is to apply to the substrate a paste or a paint containing a metal, such as silver, in finely divided form. Alternatively, the conductive coatings may be applied to the substrate before the deposition of the semiconductor. In this case, the conductive coatings are protected by a mask during the evaporation step. Each conductive coating 22 must be in contact with an end of the photovoltaic film 20. To complete the device, electrode leads 24, such as a wire of copper or nickel, are attached to each conductive coating 22 by means of a pressure contact, or by soldering.

The device shown in Fig. 2 generates an output voltage which depends, among other factors, on the spacing between the electrodes. The longer the film, the greater the voltage produced. A device of this type, in which the conductive coatings are spaced about two inches apart, can generate across its electrodes an E.M.F. of 1500 volts, when exposed to a light level about that of sunlight. Light shining down directly on the photovoltaic film produces a voltage with polarity in a given direction. The polarity is partly dependent on the choice of substrate and the presence of impurities. The polarity may be reversed by heat treatment of the device. The direction of the generated E.M.F. is determined principally by the angle of deposition of the semiconductive material. For a Pyrex glass substrate, the negative terminal is that end of the film for which $\theta$, the angle between the direction of deposit and the normal to the substrate, has the smaller value.

Referring to Figure 3, another embodiment of the invention uses the direction of deposit of the semiconductor to control the polarity of the generated E.M.F. In this form of the invention, a transparent substrate 14 is selected, for example quartz. The quartz slab 14 is covered with a first photovoltaic layer or film 20 by depositing cadmium telluride on one face of the quartz. Film 20 is deposited at an angle with the normal to the quartz face, since cadmium telluride is evaporated at Source Position 1. Thereafter a second film or layer 30 of cadmium telluride is deposited on top of film 20. Film 30 is deposited by evaporation from Source Position 2, so that the angle of deposition with the normal to the quartz face is equal to that of film 20, but on the opposite side of the normal. Each film is thick enough to absorb most of the incident light. The device is completed by making conductive coatings 22 at each end of the two-layer film, and connecting an electrode 24 to each conductive coating, in a manner similar to the embodiment shown in Figure 2.

When the two-layer device thus prepared is illuminated from the top, so that the light is incident on film 20, the voltage across the electrodes has a given polarity. As mentioned above, the negative terminal in each case is that end of the film for which $\theta$, the angle between the direction of deposit and the normal to the substrate, has the smaller value. When the device is illuminated from the bottom, so that the light passes through the transparent substrate 14 and is absorbed in film 20, the voltage produced is of opposite polarity. Such a device may be used, for example, to telemeter the direction of incident radiation, or in certain types of directional apparatus, such as servo mechanisms. Since the polarity of the direct-current voltage generated depends only upon which face is illuminated, it may be readily reversed by revolving the light source around the device, or by rotating the device. The device may also be used to compare two sources of light incident on opposite faces of the cell, by comparing the resultant voltage or current.

Devices such as shown in Figures 2 and 3, in which cadmium telluride is the semiconductor, exhibit constant quantum efficiency over the range 8000 to 3000 angstroms. Within these wavelengths, each photon of incident radiation generates one electron-hole pair. The voltage generated by these devices increases with light intensity as far as has been measured. The voltage generated tends to increase with increasing angle of deposition, and also with increasing film thickness up to an optimum value between about one and two microns.

The exact mechanism which enables photovoltaic devices of this invention to produce such high voltages is as yet not fully understood. A tentative explanation will now be discussed in connection with Figures 4 to 6. It will be understood that the invention is not limited by or dependent on any hypothesis as to its mode of operation.

The photovoltaic film of cadmium telluride which has been deposited on a substrate at an angle with the normal to the substrate cannot consist of a single PN junction. As discussed above, a single PN junction cannot generate a voltage greater than 1.45 volts, which is the value of the energy gap of cadmium telluride. Since voltages which are greater by three orders of magnitude have been produced, the film must contain a plurality of rectifying junctions aligned in series so that the voltages of the junctions are additive. Furthermore, the series of rectifying junctions must be asymmetric, since a series of electrically symmetric PN junctions evenly illuminated would not produce any output voltage at all for an even number of junctions. As discussed above, the output of one junction would be opposed by the equal and opposite output of the next junction. An odd number of junctions would produce an E.M.F. which at best would not be greater than the energy gap of the semiconductor.

Several types of electrical asymmetry are possible in series of PN junctions. For example, the film may consist of a series of cells arranged back to back, in which large-area cells alternate with small-area cells. Under uniform illumination, a series of cells so arranged would produce a photovoltage greater than the energy gap of the film material.

Another type of asymmetry might arise if transition regions of one kind, for example P to N transition regions, were operative to produce a photo-voltage, while the alternate N to P transition regions were not operative, due for example to high recombination rates.

An asymmetric structure may be formed in the photovoltaic film by the process shown in Figure 4. When the cadmium telluride, or other semiconductor, is deposited at an angle with the normal to the substrate, the layer is not continuous at first. It is possible for the molecules of the semiconductor to move around by surface diffusion until some crystallographic organization occurs.

Some materials move more than others, and raising the substrate temperature increases surface diffusion rates for all materials. It is believed that initially small discrete crystallites of the semiconductor form on the surface of the substrate. At this stage the film consists of unconnected islands. As the evaporation of the semiconductor continues, each crystallite grows in size until it finally meets with an adjacent crystallite. However, the growth of each crystallite is not uniform in all directions, since the cadmium telluride molecules arrive at an angle, so that one face of each crystallite is exposed, while the opposite face is shadowed. For each crystallite the anistropic growth is mainly in the direction of the evaporator. Each crystallite grows faster in the preferred direction, and eventually grows into the shadowed face of a neighboring crystallite.

Referring to Figure 5, the end results of such a process of growth is a film which is an array of single crystals with grain boundaries at the crystal interfaces. It will be understood that the structure shown in Figure 5 is a model, and that the precise nature of the organization of the photovoltaic film has not yet been demonstrated. In this model, the abrupt PN transitions are located in the crystal interfaces, while the gradual PN transitions are located in the crystal body. Since the shadowed faces of the crystallites grow slowly, it is probable that these faces are well ordered. The exposed face of each crystallite grows rapidly, and must become disordered in the region where it grows on to one of the shadowed faces. Each growing face can order itself as long as it is not near another crystallite, but some strains and disorder must set in as the growth approaches the neighboring crystal, and must reach a maximum when contact is reached. Hence, each crystal has a well ordered face and a poorly ordered face, and these faces are all aligned due to the direction of arrival of the semiconductor on to the substrate. In this manner a type of anisotropy can be built into the photovoltaic film.

Although the exact shape of the grain boundaries has not yet been determined, anisotropy of the photovoltaic film has been demonstrated by directing a beam of light either perpendicularly to the exposed film surface, or through the substrate to the underside of the film. In each case, preferred scattering of the light in the direction of the evaporator was found.

Figure 6 is an energy level diagram of the series of PN junctions in an ordered photovoltaic film according to the model discussed in connection with Figures 4 and 5. The light received by the abrupt set of transition regions, which in this example is the N to P transition regions, is less than the light received by the more gradual P to N transition regions due to the difference in areas. Thus the voltage produced by each abrupt transition region is not sufficient to counter balance the voltage produced by each adjacent gradual transition region, and the net balance is cumulative over the entire series, so that voltages much higher than the semiconductor band gap are generated.

As the above discussion shows, the high photovoltages obtained by this invention are not due to the unique electrical or chemical properties of cadmium telluride, but rather to the physical organization of a semiconductive film which has been deposited on an insulating substrate at an angle substantially different from 90°. The same effect has been found with other semiconductive materials. For example, films of pure cadmium selenide deposited at an angle on a heated insulating substrate have been found to produce 3 volts under illumination, although the energy gap of cadmium selenide is only 1.7 electron volts. However, cadmium telluride has the highest output voltage of the semiconductive materials tested.

There have thus been described improved photovoltaic devices and improved methods of making the devices. Similar methods may be used to prepare large-area cells for the direct conversion of sunlight to electrical energy. Photovoltaic devices made in accordance with this invention have produced an output of about 300 volts per cm. of cadmium telluride film when exposed to sunlight. For comparison, the output voltage of silicon photocells presently available commercially, and known as solar batteries, is 0.4 volt.

It will be understood that the above-described arrangements are merely illustrative of the principles of the invention. Many other arrangements may be devised to deposit semiconductive material on a substrate at an angle with the normal to the substrate, and other semiconductors may be utilized by those skilled in the art without departing from the spirit and scope of the invention.

What is claimed is:

1. A method of making a device for converting radiant energy into electrical energy, comprising depositing a film of a vacuum evaporated semiconductor on a heated insulating substrate, said deposition being performed at an angle to the normal to said substrate, said angle being entirely on one side of said normal to said substrate.

2. A method of making a semiconductor device for converting radiant energy into electrical energy at an output voltage greater than the bandgap of said semiconductor, comprising depositing a film of said semiconductor by vacuum evaporation on a heated insulating substrate, said deposition being performed at an angle to the normal to said substrate, said angle being always on the same side of said normal to said substrate.

3. A method of making a device for converting radiant energy into electrical energy, comprising depositing a film of vacuum evaporated cadmium telluride on a heated insulating substrate, said deposition being performed at an angle to the normal to said substrate, said angle being entirely on one side of said normal to said substrate.

4. A method of making a device for converting radiant energy into electrical energy, comprising depositing a layer of vaporized cadmium telluride on a heated insulating substrate, said deposition being performed in a vacuum at an angle to said substrate, said angle being substantially different from 90 degrees and being entirely on one side of the normal to said substrate.

5. A method of making a device for converting radiant energy into electrical energy, comprising depositing a coating of cadmium telluride on a heated insulating substrate, said deposition being accomplished by directing cadmium telluride vapors against one face of said substrate in a vacuum at an acute angle with said face, said angle being entirely on one side of the normal to said face.

6. A method of making a device for converting radiant energy into electrical energy, comprising vacuum evaporating semiconductive cadmium telluride and depositing a film thereof on a heated insulating substrate, so that substantially all cadmium telluride molecules are deposited at about the same angle to said substrate, and said angle is substantially different from 90 degrees and is entirely on one side of the normal to said substrate.

7. The method according to claim 6, in which said insulating substrate is quartz.

8. The method according to claim 6, in which said insulating substrate is glass.

9. A method of making a device for converting radiant energy into electrical energy, comprising depositing a film of cadmium telluride on a heated insulating substrate by vacuum evaporation, said deposition being performed at an acute angle to said substrate, said angle being entirely on one side of the normal to said substrate.

10. A method of making a device for converting radiant energy into electrical energy, comprising depositing a film of cadmium telluride by vacuum evaporation on a transparent heated insulating substrate, said deposition being performed at an acute angle to said substrate.

11. A method of making a device for converting radiant energy into electrical energy, comprising depositing a film of cadmium telluride by vacuum evaporation on an insulating substrate, said deposition being performed at an acute angle to said substrate, said angle being entirely on one side of the normal to said substrate, said substrate being maintained at a temperature of about 100° C. to 250° C. during said deposition.

12. The method according to claim 11, in which said insulating substrate is glass.

13. The method according to claim 11, in which said insulating substrate is fused quartz.

14. A method of making a device for converting radiant energy into electrical energy, comprising depositing a first film of cadmium telluride on an insulating transparent substrate by vacuum evaporation, said deposition being performed at a first acute angle to said substrate, then depositing a second film of cadmium telluride over said first film by vacuum evaporation, said second film being deposited at a second acute angle to said substrate, said angles being entirely on opposite sides of the normal to said substrate, said substrate being maintained at a temperature of about 100° C. to 250° C. during said deposition of both said films.

15. A photovoltaic device for converting radiant energy into electrical energy, comprising an insulating substrate, a vacuum evaporated semiconductor film on one side of said substrate, said film having been deposited at an angle to the normal to said substrate, said angle being entirely on one side of said normal, two conductive coatings at opposite ends of said film, and an electrode lead attached to each said coating.

16. A photovoltaic device for converting radiant energy into electrical energy, comprising an insulating substrate, a vacuum evaporated cadmium telluride film on one face of said substrate, said film having been deposited at an angle to the normal to said substrate, said angle being entirely on one side of said normal, two conductive coatings at opposite ends of said film, and an electrode lead attached to each said coating.

17. A photovoltaic device comprising a transparent insulating substrate, a first vacuum evaporated semiconductive film on one face of said substrate, a second vacuum evaporated semiconductive film on said first film, said first and second films having been deposited at an angle to the normal to said substrate, said angle of deposition for said films being on opposite sides of said normal to said substrate, two conductive coatings at opposite ends of said films, and an electrode lead attached to each said coating.

References Cited in the file of this patent

UNITED STATES PATENTS 2,428,868 Dimmick -------------- Oct. 14, 1947